United States Patent [19]

Conger

[11] 4,376,311

[45] Mar. 8, 1983

[54] ELECTRO-MECHANICAL SWITCHING SYSTEM

[75] Inventor: Ronald R. Conger, Binghamton, N.Y.

[73] Assignee: General Electric Company, Lynchburg, Va.

[21] Appl. No.: 287,779

[22] Filed: Jul. 28, 1981

[51] Int. Cl.³ .................. H04B 1/26; H03K 21/36
[52] U.S. Cl. .................. 455/158; 455/170; 455/179; 377/33; 377/45
[58] Field of Search .............. 455/154, 157, 158, 170, 455/176, 178, 179, 183, 185, 76, 77; 235/92 K, 92 MP, 92 EV, 92 C, 92 FQ; 340/362, 363

[56] References Cited

U.S. PATENT DOCUMENTS

| 3,182,207 | 5/1965 | Kaufmann | 235/92 EV |
| 3,943,338 | 3/1976 | Cagniere | 235/92 EV |
| 4,065,720 | 12/1977 | Pogue | 455/179 |
| 4,220,849 | 9/1980 | Harzer | 235/92 EV |

Primary Examiner—Marc E. Bookbinder
Attorney, Agent, or Firm—Cushman, Darby & Cushman

[57] ABSTRACT

An electro-mechanical switching system for selecting one of a plurality of selectable items, such as channels, comprising an uncoded rotary switch having N movable terminals and N discrete angular positions, a flip-flop or other memory device coupled to the switch, one or more up/down counters and a display for indicating the particular item selected.

6 Claims, 2 Drawing Figures

ELECTRO-MECHANICAL SWITCHING SYSTEM

BACKGROUND OF THE INVENTION

This invention relates in general to switching systems and more specifically to switching systems particularly suited for electronic channel selection in communication equipment.

In the evolution of two-way communication equipment, there is a demand to increase the number of channels on which the equipment can selectively operate. For mobile or portable radio equipment, it is also desirable to locate user operated controls, such as a channel selector switch, in a relatively small control head located at some convenient point of access to the user while installing the more bulky radio circuits at a less accessible location such as the trunk of a vehicle. Conventional mechanical switches have a common "pole" and a "throw" for each selectable channel. As the number of channels to be user selected grows with each generation of radio equipment, the size of conventional switches becomes large due to the high number of "throw" contacts required. Such switches, because of their bulk and high number of contacts, become inconvenient to use and impractical to fabricate.

Various alternatives to conventional switches have been attempted. Such alternatives include the use of push-button panel switches, and light beams for detecting switch movements. However, these approaches have not produced the highly desirable small size desired for a switch to be located in a control head. Another approach utilizes two separate and distinct switches in digital circuit. One such switch controls a "tens" place and the other controls the "units" place. In such systems, conventional switching techniques are used. Although the dual switch digital system achieves the small size objective, it is not convenient for the user to operate.

One known electronic channel selector scheme is shown in U.S. Pat. No. 4,065,720—Pogue, Jr. (1977). That particular arrangement utilizes a multiple position continuous rotation rotary switch having three states that are repeated cyclically. The switch has N discrete angular positions, N/3 movable angularly spaced grounded contacts and three stationary contacts positioned with predetermined angular spacing. As the movable contacts are rotated in a "clockwise" direction, the three stationary contacts are engaged and grounded in a first sequence by a movable contact. But, as the movable contacts are rotated in a counter-clockwise direction, the three stationary contacts are engaged and grounded in a second sequence, opposite to the first sequence. The stationary contacts are coupled to a three-state latch which provides a digital signal identifying the last of the stationary contacts to be grounded by a movable contact. The digital signal output of the three-stage latch is coupled to a flip-flop memory and to a switch position comparator and clock. The flip-flop memorizes the output of the three-state latch and provides, at an output thereof, a signal indicating the output of the three-state latch. The switch position comparator and clock compare the present position of the rotary switch, as represented by the output of the three-state latch, with the position of the rotary switch as represented by the output of the flip-flop memory. When the digital signal output of the three-state latch varies from the digital signal output of the flip-flop memory, up/down control signals are provided on output lines of the switch position comparator and clock to operate an up/down counter. The counter signals in turn effect channel selection.

Although the Pogue, Jr. system is effective for its purposes, it depends for its operation, upon a rather complex circuit arrangement. Also, the switch itself causes some operational disadvantage. It is not clear from the Pogue, Jr. specification whether his switch is provided with detents defining, in conjunction with the movable contacts, discrete angular positions of the switch. If detents are provided, it would take three (3) "clicks" to obtain one (1) count. This could, under certain circumstances cause a partially effective count. It is therefore desirable to further simplify the electronic switching arrangement to provide a more compact and easier to utilize operational control for radio equipment and one that can be manufactured in quantity more inexpensively than known switching arrangements.

SUMMARY OF THE INVENTION

Therefore, the present invention provides a switching arrangement using an uncoded and un-stopped (continuously rotatable) rotary switch having an integer number N of movable terminals, N discrete angular positions and three stationary terminals. The center stationary contact includes a detent, which, together with protruding portions of the movable terminals, provides stable switch positions for the movable contacts. The movable and stationary terminals are positioned and spaced such that by rotating the switch clockwise from one discrete angular position to the next, a movable terminal makes electrical contact with a first stationary terminal then another movable terminal makes electrical contact with a third stationary terminal before any movable terminal makes electrical contact with the second stationary terminal; and by rotating the switch counter-clockwise, a movable terminal makes electrical contact with the third stationary terminal then a different movable terminal makes electrical contact with the first stationary terminal before any movable terminal makes electrical contact with the second stationary terminal. This mechanical switch configuration renders the switch less apt to produce an error in switching because the movable terminals must stop in the detent provided in the second stationary terminal. The terminal layout requires fewer detents (only one) than would be required in known switch layouts, and makes it possible to build smaller switches that switch more efficiently than known switches.

The second (central) of the three stationary contacts provides a clock signal directly to a counter. The first and third (outer) stationary contacts provide set and reset signals directly to a flip-flop or other memory device. The "Q" output of the flip-flop is coupled directly to an up/down input of a counter. Thus, the present arrangement is considerably more simplified, offering the advantages of less expensive fabrication and more compact construction. In a control head including many operating controls, space saved by simplifying the channel selection circuitry can be utilized for other controls.

BRIEF DESCRIPTION OF THE DRAWINGS

The invention will be understood by reference to the following detailed description and appended claims when read in conjunction with the drawings, wherein:

DETAILED DESCRIPTION OF THE PREFERRED EMBODIMENT

Figure 1:
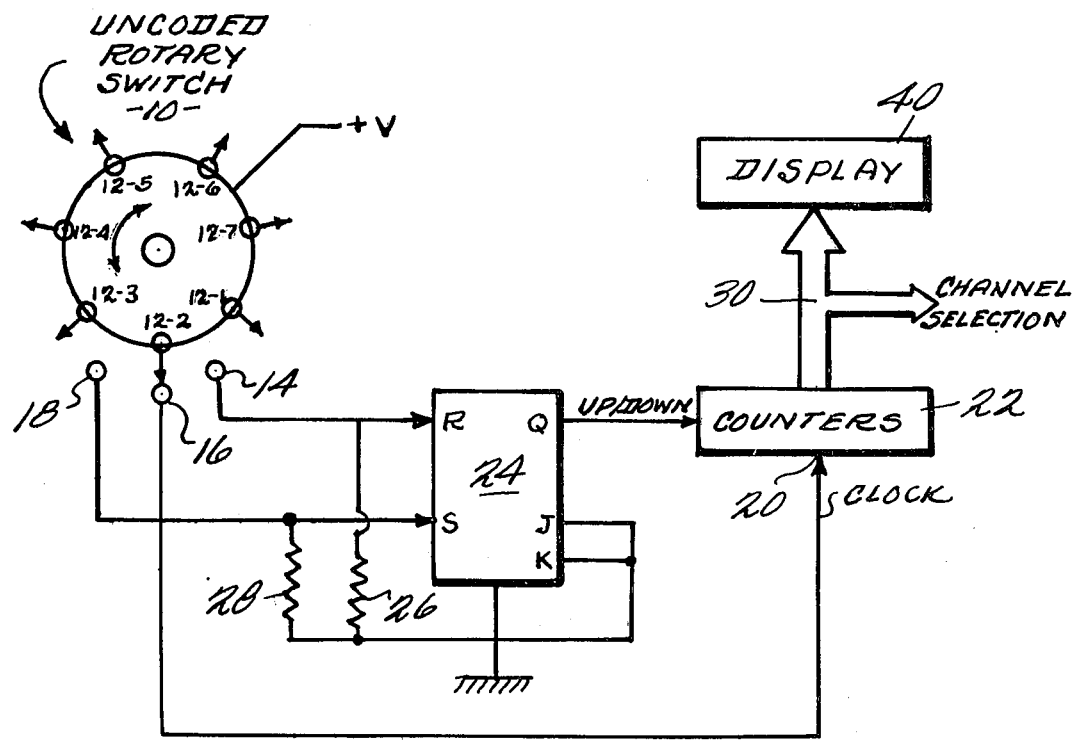
FIG. 1 is a diagram of the electronic switching circuit according to the present invention, the switch being shown schematically in front view.

Referring now to FIG. 1 there is shown a schematic diagram of the electronic switching circuit according to the present invention. A user effects switching for channel selection or some other purpose by manipulation of an uncoded rotary switch 10. Rotary switch 10 includes a plurality of movable terminals 12-1 . . . 12-7 electrically connected to one another and to a voltage source +V. Rotary switch 10 also includes three stationary terminals 14, 16 and 18. Terminal 16, the central terminal, has a detent formed therein to "capture" a downwardly protruding portion of a movable terminal coming into contact therewith. When switch 10 is rotated either clockwise or counter-clockwise, it will have "click" stops corresponding to each movable terminal 12 crossing stationary terminal 16. For each "click" stop, the movable terminals are electrically coupled to stationary terminal 16. Stationary terminals 14, 16 and 18 are constructed such that each movable terminal makes contact with any stationary terminal that it passes while the switch is being manipulated. No stop is provided on the switch so that it can be continuously rotated.

Stationary terminal 16 is coupled to the clock input 20 of one or more up/down counters 22. Stationary terminal 14 is coupled to the "R" (reset) input of a flip-flop 24 and stationary terminal 18 is coupled to the "S" (set) input of flip-flop 24. The R and S inputs of flip-flop 24 are coupled to ground via pull-up resistors 26 and 28 respectively. As an alternative, a J-K flip-flop can be substituted for R-S flip-flop 24. If a "J-K" flip-flop is used, the J and K inputs are coupled directly to circuit ground.

The "Q" output of flip-flop 24 is coupled to the up/-down inputs of counters 22. Depending upon the particular switch application, one or more counters 22 can be utilized depending upon the number of digits required for channel selection or other switch function. Actual channel selection is effected by the count output of counters 22 on a counter bus 30 coupled to channel selection or other control circuitry. Counter bus 30 is also coupled to a display 40 which serves as an indicator of the channel or other function selected.

Using this system arrangement, counters 22 count up or down depending upon the direction, clockwise or counter-clockwise, of rotation of rotary switch 10. The counters count up to the desired point when the switch is rotated clockwise and they count down when the switch is turned counter-clockwise. Display 40 can be any suitable display for displaying the status of counters 22 thereby indicating the channel selection obtained by manipulation of rotary switch 10.

In essence, switch 10 and flip-flop 24 pulse counters 22 to send appropriate signals to a point (not shown) where switching is supposed to change. Flip-flop 24 detects the direction of the switches motion by utilizing the spacing of the terminals on switch 10 to pulse its set or reset input. Whichever of the first or third stationary terminals is electrically coupled to movable terminals 12 last, before a clock pulse is sent to counter 22, directs counters 22 in the proper direction (either up or down). A clock pulse will be sent to counters 22 each time a movable terminal 12 "locks" into position in the detent of terminal 16.

Continuing to refer to FIG. 1, for the case wherein rotary switch 10 is turned clockwise, movable terminal 12-1 for example, will first electrically connect with stationary terminal 14 thereby placing a plus voltage on the R input of flip-flop 24. Thus, the Q output of flip-flop 24 "knows" that contact was made with stationary terminal 14. After making contact with stationary terminal 14, movable terminal 12-2 then makes contact with stationary terminal 18. This causes the Q output of flip-flop 24 to change to the last contact signal, "knowing" which direction to direct counters 22. Movable terminal 12-1 then makes electrical contact with stationary contact 16. By making contact with stationary contact 16, +V is coupled to the clock input 20 of counters 22 thereby causing them to increment.

For the case wherein switch 10 is rotated counter-clockwise, terminal 12-3 for example, would first electrically contact stationary terminal 18 thereby pulsing the "S" input of flip-flop 24. Then, terminal 12-2 contacts terminal 14 thereby pulsing the "R" input of flip-flop 24. This resets flip-flop 24 and causes its Q output to indicate that rotation is occurring counter-clockwise (corresponding to down). Thus, when terminal 12-2 passes terminal 14 and terminal 12-3 makes contact with terminal 16, a clock pulse to counter 22 causes the counter to decrement.

Figure 2:
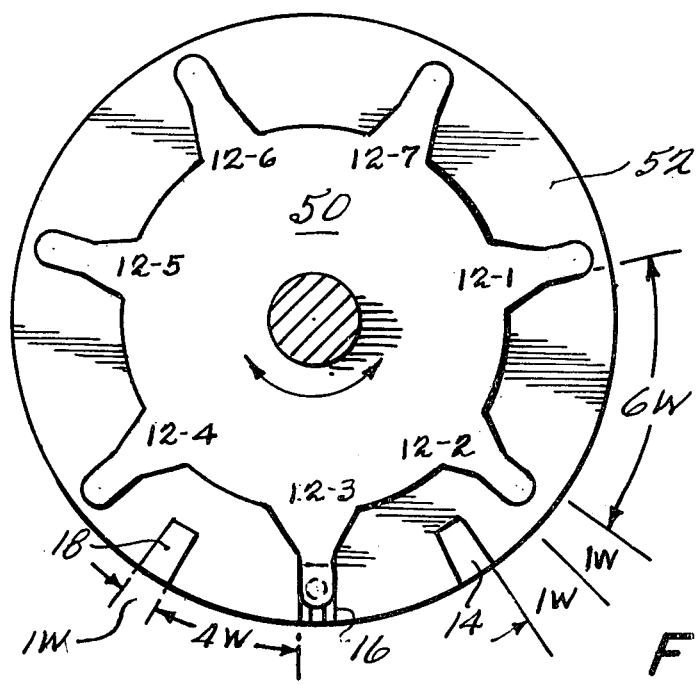
FIG. 2 is a diagram of the rotary switch in a front "see through" view for use in the switching circuit according to the present invention.

Referring now to FIG. 2 there is shown a more detailed diagram of switch 10. Rotary switch 10 includes an inner turning disc 50 to which terminals 12 are both mechanically and electrically coupled. Terminals 14, 16 and 18 are mounted on an outer ring member 52 insulated from inner disc 50. However, terminals 14, 16 and 18 are positioned such that terminals 12 make contact therewith when disc 50 is rotated. Terminals 14, 16 and 18 on outer ring member 52 are spaced in a special arrangement, as shown in the Figure, in order to assure electrical contact with inner disc 50 in the proper order when moving from the "locked" position of switch 10 to the next "locked" position. As stated, a locked position of switch 10 always corresponds to one of terminals 12 making continuous contact with terminal 16 having a detent therein.

The distance between terminals 14, 16 and 18 is four times the width of the terminals themselves, thus, if each of terminals 14, 16 and 18 has a width W, then the distance between the closest points of adjacent terminals would be 4W.

Terminals 12 on inner disc 50 are preferably of the same width as terminals 14, 16 and 18. The actual width for a particular design would depend upon the size of the switch and the number of contacts desired per switch revolution and upon the strength needed in the contacts to produce the required switch life. The distance between the terminals 12 of inner disc 50 is preferably six times the contact width and each "locks" into position on terminal 16. As previously stated, switch 10 would not have a stop so that it could be continuously rotated either clockwise or counter-clockwise.

In the embodiment shown in FIG. 1, terminals 12 are coupled to a positive voltage +V so as to produce a logic level "high" signal on either the S or R inputs of flip-flop 24 and a positive clock signal to clock input 20 of counters 22. However, terminals 12 could, in an alternative design be coupled to ground or to a negative voltage.

Although the preferred embodiment shown in FIG. 1 utilizes an RS or JK flip-flop, any other memory element can be substituted with appropriate circuit modification without deviating from the inventive concept set forth herein.

While the invention has been described in connection with what is presently considered to be the most practical and preferred embodiments, it is to be understood that the invention is not to be limited to the disclosed embodiments but on the contrary, is intended to cover various modifications and equivalent arrangements included within the spirit and scope of the appended claims, which scope is to be accorded the broadest interpretation so as to encompass all such modifications and equivalent structures.

I claim:

1. An electro-mechanical selection system, comprising:
 a rotary switch having an integer number N of movable terminals electrically coupled with one another and N discrete angular positions and first, second and third stationary terminals, the movable and stationary terminals being positioned and spaced so that by rotating the switch clockwise from one discrete angular position to the next discrete angular position, a movable terminal makes electrical contact with the first stationary terminal then another movable terminal makes electrical contact with the third stationary terminal before any movable terminal makes electrical contact with the second stationary terminal; and by rotating the switch counterclockwise, a movable terminal makes electrical contact with the third stationary terminal then a different movable terminal makes electrical contact with the first stationary terminal before any movable terminal makes electrical contact with the second stationary terminal;
 means for coupling a signal to all of the movable terminals;
 a memory element coupled to the first and third stationary terminals for memorizing which of the first or third stationary terminals was contacted last before the second stationary terminal was contacted by a movable terminal; and
 an up/down counter having an up/down input for controlling whether the counter counts up or down coupled to an output of the memory element and a clock input coupled to the second stationary contact for receiving a clock signal from the second stationary contact after an up/down selection thereof was determined by the memory element, whereby the counter counts in one direction (up or down) when the switch is rotated clockwise and counts in the other direction (down or up) when the switch is rotated counter-clockwise.

2. An electro-mechanical selection system according to claim 1 wherein the discrete angular positions of said switch are defined by a detent formed in said second stationary contact for retaining protruding portions of said movable terminals.

3. An electro-mechanical selection system according to claim 1 further including a display coupled to an output of the up/down counter for displaying the state thereof.

4. An electro-mechanical selection system according to claim 1 wherein the memory means is a flip-flop.

5. An electro-mechanical selection system according to claim 1 including a plurality of up/down counters wherein the up/down input of each such counter is coupled to the output of the memory element and the clock input of each counter is coupled to the second stationary terminal.

6. An electro-mechanical selection system according to claim 5 further including means coupled to an output of the up/down counter for effecting channel selection in a communication device.

* * * * *